United States Patent
Yang et al.

(10) Patent No.: US 9,716,244 B2
(45) Date of Patent: Jul. 25, 2017

(54) OLED DEVICE WITH ANODE OF SILVER NANOWIRE AND FABRICATION METHOD THEREOF, DISPLAY SUBSTRATE

(71) Applicants: BOE Technology Group Co., Ltd., Beijing (CN); Beijing BOE Optoelectronics Technology Co., Ltd., Beijing (CN)

(72) Inventors: Jiuxia Yang, Beijing (CN); Jiantao Liu, Beijing (CN); Feng Bai, Beijing (CN)

(73) Assignees: BOE Technology Group CO., Ltd., Beijing (CN); Jeijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/741,720

(22) Filed: Jun. 17, 2015

(65) Prior Publication Data
US 2016/0233450 A1   Aug. 11, 2016

(30) Foreign Application Priority Data
Feb. 10, 2015  (CN) .......................... 2015 1 0069596

(51) Int. Cl.
*H01L 51/52* (2006.01)
*H01L 51/00* (2006.01)

(52) U.S. Cl.
CPC ...... *H01L 51/5206* (2013.01); *H01L 51/0023* (2013.01)

(58) Field of Classification Search
CPC .................. H01L 51/5206; H01L 51/0023
See application file for complete search history.

(56) References Cited

U.S. PATENT DOCUMENTS

| | | | |
|---|---|---|---|
| 2012/0286248 A1* | 11/2012 | Lee ...................... | H01L 51/5253 257/40 |
| 2014/0054442 A1* | 2/2014 | Huang ................... | H01L 31/02 250/200 |
| 2014/0061617 A1* | 3/2014 | So ....................... | H01L 51/5271 257/40 |
| 2014/0070191 A1* | 3/2014 | So ....................... | H01L 27/3227 257/40 |
| 2014/0111652 A1* | 4/2014 | So ............................. | G01J 1/58 348/164 |

(Continued)

FOREIGN PATENT DOCUMENTS

| CN | 103996457 A | 8/2014 |
|---|---|---|
| CN | 104183303 A | 12/2014 |
| WO | 2014187798 A1 | 11/2014 |

OTHER PUBLICATIONS

Jun. 6, 2016—(CN)—First Office Action Appn 201510069596.5 with English Tran.

(Continued)

*Primary Examiner* — Mamadou Diallo
(74) *Attorney, Agent, or Firm* — Banner & Witcoff, Ltd.

(57) ABSTRACT

An OLED device and a fabrication method thereof, a display substrate and a display device are provided. The OLED device comprises: a base substrate, and an anode, an organic light emitting layer and a cathode which are sequentially stacked on the base substrate. The anode includes a silver nanowire material.

10 Claims, 3 Drawing Sheets

(56) References Cited

U.S. PATENT DOCUMENTS

| | | | |
|---|---|---|---|
| 2014/0159011 A1* | 6/2014 | Suzuki | H01L 51/0072 257/40 |
| 2014/0175410 A1* | 6/2014 | So | H01L 27/288 257/40 |
| 2015/0348675 A1* | 12/2015 | Qu | H01B 3/46 428/215 |
| 2016/0126486 A1* | 5/2016 | Scharner | H01L 51/5203 257/40 |
| 2016/0190507 A1* | 6/2016 | Doust | H01L 51/0039 257/40 |

OTHER PUBLICATIONS

Oct. 26, 2016—(CN) Second Office Action Appn 201510069596.5 with English Tran.

* cited by examiner

US 9,716,244 B2

OLED DEVICE WITH ANODE OF SILVER NANOWIRE AND FABRICATION METHOD THEREOF, DISPLAY SUBSTRATE

This application claims priority to Chinese Patent Application No. 201510069596.5 filed on Feb. 10, 2015. The present application claims priority to and the benefit of the above-identified application and is incorporated herein in its entirety.

TECHNICAL FIELD

The disclosure relates to an OLED device, a fabrication method thereof, and a display substrate.

BACKGROUND

With development of display technology, an Organic Light Emitting Diode (OLED) has been widely used in the display field. A commonly-used OLED device for displaying usually comprises a base substrate, an anode, a hole injection layer, a hole transport layer, an organic light emitting layer, an electron transport layer, an electron injection layer and a cathode. The anode is usually made of ITO. Because a micro-cavity structure exists between the anode and the base substrate, and there is a higher micro-cavity effect between the anode made of ITO and the base substrate, a light conversion efficiency of the OLED device is lower, resulting in lower intensity of light emitted from the OLED device.

SUMMARY OF THE INVENTION

According to an embodiment of the present invention, there is provided an OLED device, comprising: a base substrate; an anode, an organic light emitting layer and a cathode which are sequentially stacked on the base substrate, wherein the anode includes a silver nanowire material.

According to another embodiment of the present invention, there is provided a display substrate, comprising the above-mentioned OLED device.

According to still another embodiment of the present invention, there is provided a fabrication method of an OLED device, comprising: forming a pattern of a silver nanowire film; and drying and curing the silver nanowire film, to form an anode of the OLED device.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
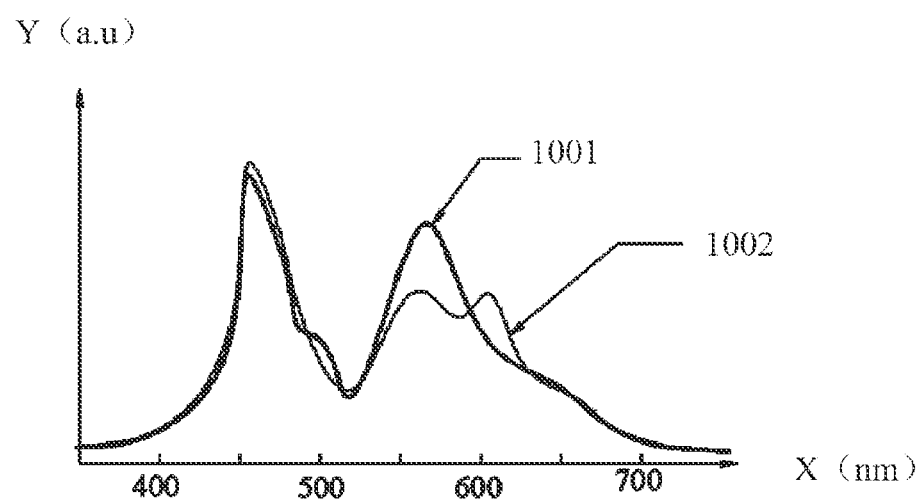
FIG. 1 is a spectrogram of an OLED device provided by an embodiment of the present invention and an OLED in the prior art.

In order to make a micro-cavity effect of an OLED device much lower, and improve a luminous intensity of the OLED device, an embodiment of the present invention provides an OLED device. The OLED device comprises an anode, a hole injection layer, a hole transport layer, an organic light emitting layer, an electron transport layer, an electron injection layer and a cathode which are formed on a base substrate. The anode includes a silver nanowire material. A refractive index of the silver nanowire material is lower than that of ITO, so an intensity of interference occurred on an interface between the anode and any other layer can be lowered, thereby reducing the micro-cavity effect, and improving the luminous intensity of the OLED device. Of course, the OLED device provided by the embodiment of the present invention can be of a top-emitting type, can be of a bottom-emitting type, or can be of a double-sided emitting type, which is not limited here. FIG. 1 illustrates a spectrogram of an OLED device provided by an embodiment of the present invention and an OLED in a comparison example. In the diagram, a horizontal coordinate X refers to a wavelength of light, and a vertical coordinate Y refers to light intensity; a curve 1001 is a spectral curve of the OLED device provided by the embodiment of the present invention, while a curve 1002 is a spectral curve of the OLED device in which the anode is made of ITO in the comparison example. As compared with a standard spectral curve, the curve 1001 is much similar to the standard spectral curve. It should be noted that, for an OLED device of which an anode is made of silver nanowire material, whether the OLED device is a top-emitting type, a bottom-emitting type or a double-sided emitting type, the spectrum thereof is given with reference to FIG. 1, which will not be repeated here.

Embodiment I

Figure 2:
FIG. 2 is a structural schematic diagram of a top-emitting OLED device provided by an embodiment of the present invention.

FIG. 2 is a schematic diagram of a top-emitting OLED device according to the embodiment of the present invention. The OLED device comprises an anode 2, a hole injection layer 3, a hole transport layer 4, an organic light emitting layer 5, an electron transport layer 6, an electron injection layer 7 and a cathode 8 which are formed on a base substrate 1. The anode 2 includes a silver nanowire material. In the embodiment of the present invention, the anode 2 of the OLED device includes a silver nanowire material; a refractive index of the silver nanowire material is lower than that of ITO, so an intensity of interference occurred on an interface between the anode 2 and any other layer (e.g., the base substrate or the hole injection layer 3) can be lowered, thereby reducing the micro-cavity effect, and improving the luminous intensity of the OLED device.

In an example, in order to make the anode 2 including the silver nanowire material not be easily oxidized, and improve stability of the OLED device, the OLED device further comprises a protective layer 9. The protective layer 9 is formed on the anode 2, and the protective layer 9 includes a conductive polymer material. In the embodiment of the present invention, the anode 2 including the silver nanowire material is provided with the protective layer 9, to realize stabilization of the anode 2.

In an example, the conductive polymer material includes at least one selected from a group consisted of polyacetylene, polythiophene, polypyrrole, polyaniline, polyphenylene, polyphenylene acetylene, and polydiacetylene.

The above are to describe some embodiments of the present invention, but are not intended to limit the invention. For example, the OLED device according to the embodiment of the present invention may comprise an anode, an organic light emitting layer and a cathode which are sequentially stacked, and the anode includes a silver nanowire material.

The anode of the OLED device according to the embodiment of the present invention includes a silver nanowire material. Because a refractive index of the silver nanowire material is lower than that of ITO, as compared with the anode made of ITO in the prior art, the intensity of interference occurred on an interface between the anode of the OLED device provided by the embodiment of the present invention and any other layer can be lowered, which accordingly reduces the micro-cavity effect, thereby improving the luminous intensity of the OLED device.

Embodiment II

The embodiment of the present invention provides a display substrate, comprising the OLED device provided by the above embodiment.

The anode of the OLED device in the display substrate according to the embodiment of the present invention includes a silver nanowire material. Because a refractive index of the silver nanowire material is lower than that of ITO, as compared with the anode made of ITO in the prior art, the intensity of interference occurred on an interface between the anode of the OLED device provided by the embodiment of the present invention and any other layer can be lowered, which accordingly reduces the micro-cavity effect, thereby improving the luminous intensity of the OLED device.

Embodiment III

The embodiment of the present invention provides a display device, comprising the display substrate provided by the above embodiment.

In the display device according to the embodiment of the present invention, the anode of the OLED device includes a silver nanowire material. Because a refractive index of silver nanowire material is lower than that of ITO, as compared with the anode made of ITO in the prior art, the intensity of interference occurred on an interface between the anode of the OLED device provided by the embodiment of the present invention and any other layer can be lowered, which accordingly reduces the micro-cavity effect, thereby improving the luminous intensity of the OLED device.

The OLED device provided by the embodiment of the present invention may be fabricated in different ways, especially, the anode including the silver nanowire material, may be completed by a stamping process in combination with a vacuum baking process and a hardening process, may be completed by a printing process in combination with a vacuum baking process and a hardening process, or may be completed by a coating process, a vacuum baking process, a hardening process and a patterning process.

Embodiment IV

Figure 3:
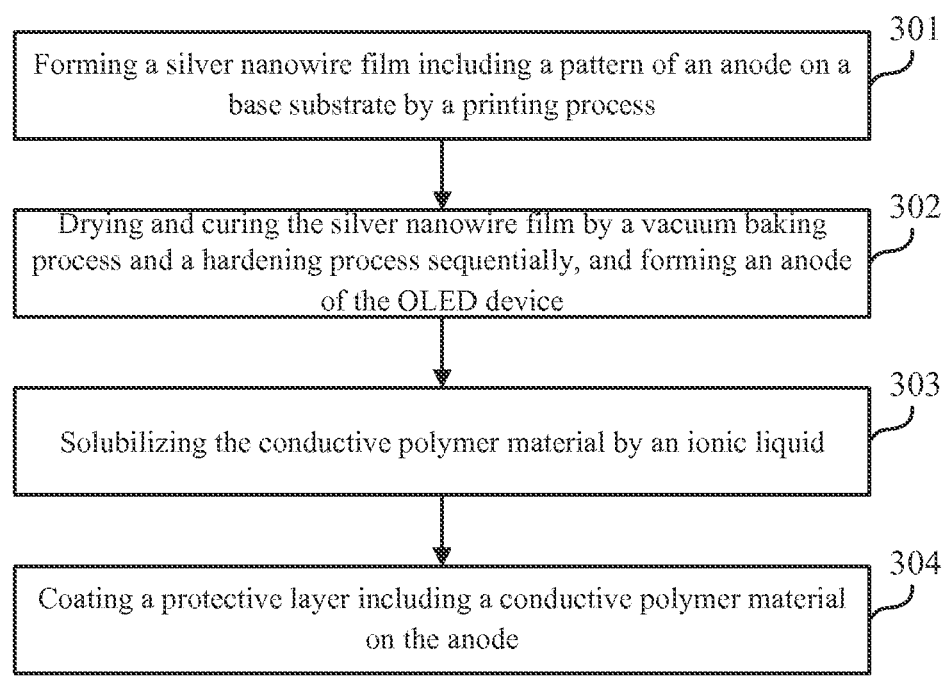
FIG. 3 is a flowchart of a fabrication method of an OLED device provided by an embodiment of the present invention.

FIG. 3 is a flowchart of a fabrication method of an OLED device provided by the embodiment of the present invention. The fabrication method comprises the following steps.

In step 301, forming a silver nanowire film including a pattern of an anode on a base substrate by a stamping or printing process.

In step 302, drying and curing the silver nanowire film by a vacuum baking process and a hardening process sequentially, and forming an anode of the OLED device. In some examples, drying and curing the silver nanowire film includes: placing the base substrate where the silver nanowire film has been formed in a vacuum oven, baking for 30 seconds~30 minutes at a temperature of 20~50° C. to dry the silver nanowire film, then baking for 15~60 minutes at a temperature of 80~250° C. to cure the silver nanowire film.

In step 304, coating a protective layer including a conductive polymer material on the anode. In the embodiment, by disposing the protective layer on the anode, the anode including the silver nanowire material cannot be easily oxidized, thereby improving the stability of the OLED device. In some examples, the conductive polymer material includes at least one selected from a group consisted of polyacetylene, polythiophene, polypyrrole, polyaniline, polyphenylene, polyphenylene acetylene, and polydiacetylene.

According to an embodiment of the present invention, before coating a protective layer including a conductive polymer material on the anode, there is a step 303, in which the conductive polymer material is solubilized by an ionic liquid. The ionic liquid includes at least one selected from a group consisted of 1-Ethyl-3-methylimidazolium hexafluorophosphate ($C_6H_{11}F_6N_2P$) liquid, 1-Butyl-3-methylimidazolium hexafluorophosphate ($C_8H_{15}F_6N_2P$) liquid, 1-Octyl-3-methylimidazolium hexafluorophosphate ($C_{12}H_{23}F_6N_2P$) liquid, 1-Ethyl-3-methylimidazolium tetrafluoroborate ($C_6H_{11}BF_4N_2$) liquid, 1-Butyl-3-methylimidazolium Trifluoromethanesulfonate ($C_9H_{15}F_3N_2O_3S$) liquid, and 1-Butyl-3-methylimidazolium chloride ($C_8H_{15}ClN_2$) liquid.

The advantegeous effects of the embodiment of the present invention are as follows: the anode of the OLED device includes a silver nanowire material. Because the refractive index of the silver nanowire material is lower than that of ITO, as compared with the anode made of ITO in the prior art, the intensity of interference occurred on an interface between the anode of the OLED device provided by the embodiment of the present invention and any other layer can be lowered, which accordingly reduces the micro-cavity effect, thereby improving the luminous intensity of the OLED device.

Embodiment V

Figure 4:
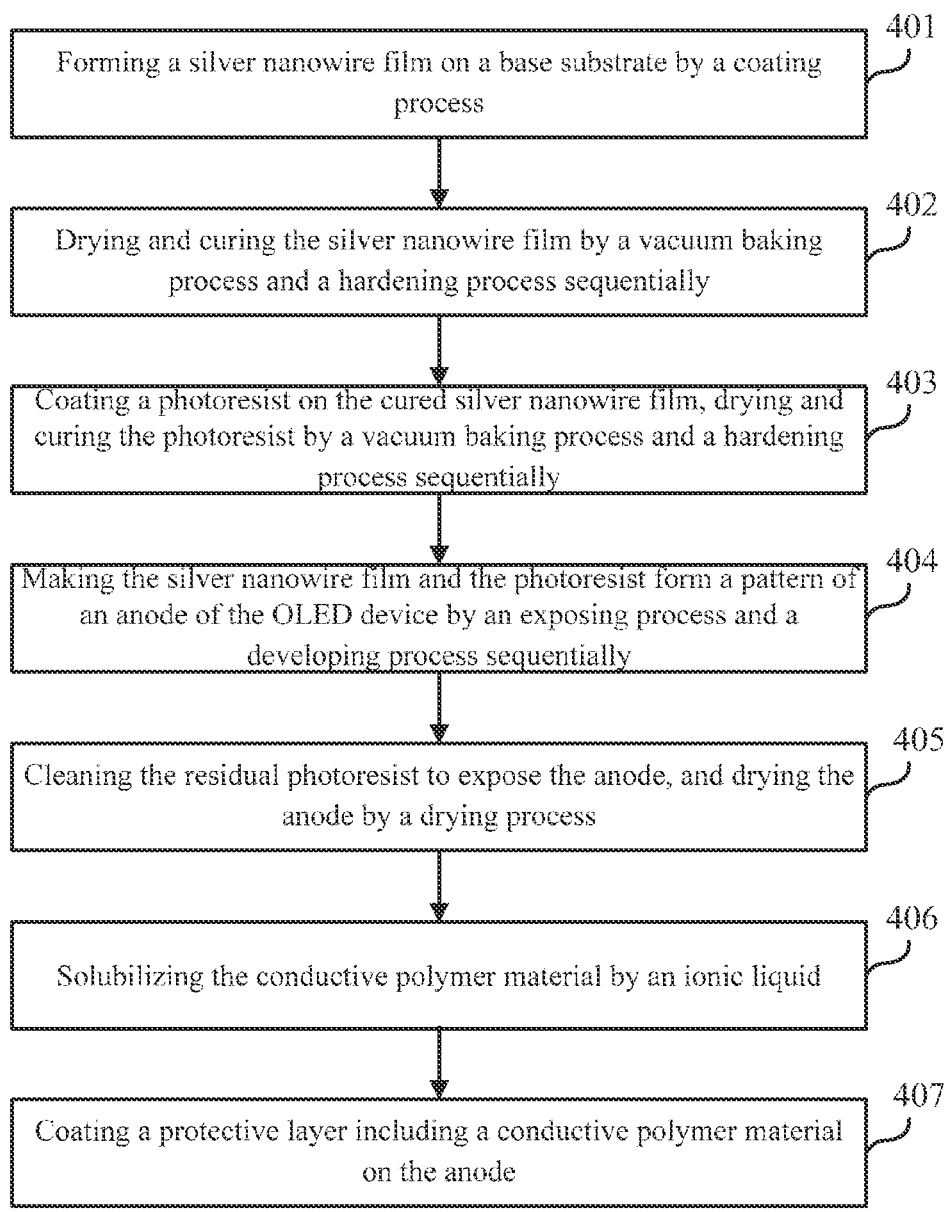
FIG. 4 is a flowchart of another fabrication method of an OLED device provided by an embodiment of the present invention.

FIG. 4 is a flowchart of another fabrication method of an OLED device provided by the embodiment of the present invention; The fabrication method comprises steps of:

In step 401, forming a silver nanowire film on a base substrate by a coating process.

In step 402, drying and curing the silver nanowire film by a vacuum baking process and a hardening process sequentially. In some examples, drying and curing the silver nanowire film by a vacuum baking process and a hardening process sequentially includes: placing the base substrate where the silver nanowire film has been formed in a vacuum oven, baking for 30 seconds~30 minutes at a temperature of 20~50° C. to dry the silver nanowire film, then baking for 15~60 minutes at the temperature of 80~250° C. to cure the silver nanowire film.

In step 403, coating photoresist on the cured silver nanowire film, drying and curing the photoresist by a vacuum baking process and a hardening process sequentially.

In some examples, drying and curing the photoresist by the vacuum baking process and the hardening process sequentially includes: placing the base substrate coated with the photoresist in a vacuum oven, baking for 60~90 seconds at a temperature of 60~80° C. to dry the photoresist, then baking for 10~18 minutes at a temperature of 150~170° C. to cure the photoresist.

In step 404, making the silver nanowire film and the photoresist form a pattern of an anode of the OLED device by an exposing process and a developing process sequentially.

In step 405, removing the residual photoresist to expose the anode, and drying the anode by a drying process.

According to an embodiment of the present invention, the fabrication method further comprises step 407. In step 407, a protective layer including a conductive polymer material is coated on the anode. In the embodiment, by disposing the protective layer on the anode, the anode including the silver nanowire material cannot be easily oxidized, thereby improving the stability of the OLED device.

In some examples, the conductive polymer material includes at least one selected from a group consisted of polyacetylene, polythiophene, polypyrrole, polyaniline, polyphenylene, polyphenylene acetylene, and polydiacetylene.

In some embodiments, before coating a protective layer including a conductive polymer material on the anode, the fabrication method further comprises step 406. In step 406, the conductive polymer material is solubilized by an ionic liquid. The ionic liquid includes at least one selected from a group consisted of 1-Ethyl-3-methylimidazolium hexafluorophosphate ($C_6H_{11}F_6N_2P$) liquid, 1-Butyl-3-methylimidazolium hexafluorophosphate ($C_8H_{15}F_6N_2P$) liquid, 1-Octyl-3-methylimidazolium hexafluorophosphate ($C_{12}H_{23}F_6N_2P$) liquid, 1-Ethyl-3-methylimidazolium tetrafluoroborate ($C_6H_{11}BF_4N_2$) liquid, 1-Butyl-3-methylimidazolium Trifluoromethanesulfonate ($C_9H_{15}F_3N_2O_3S$) liquid, and 1-Butyl-3-methylimidazolium chloride ($C_8H_{15}ClN_2$) liquid.

The advantegous effects of the embodiment of the present invention are as follows: the anode of the OLED device includes a silver nanowire material. Because the refractive index of the silver nanowire material is lower than that of ITO, as compared with the anode made of ITO in the prior art, the intensity of interference occurred on an interface between the anode of the OLED device provided by the embodiment of the present invention and any other layer can be lowered, which accordingly reduces the micro-cavity effect, thereby improving the luminous intensity of the OLED device.

The above embodiments IV and V provide two fabrication methods; however, the embodiments according to the present invention are not limited thereto. For example, the fabrication method according to the embodiment of the present invention comprises forming a pattern of a silver nanowire film; and drying and curing the silver nanowire film, to form an anode of the OLED device. And the above processes can be used instead of the patterning process and drying and curing process and so on.

The foregoing embodiments merely are exemplary embodiments of the invention, and not intended to define the scope of the invention, and the scope of the invention is determined by the appended claims.

The present application claims priority of Chinese Patent Application No. 201510069596.5 filed on Feb. 10, 2015, the disclosure of which is incorporated herein by reference in its entirety as part of the present application.

What is claimed is:

1. An organic light emitting diode (OLED) device, comprising:
a base substrate; and
an anode, an organic light emitting layer, and a cathode which are sequentially stacked on the base substrate,
wherein the anode includes a silver nanowire material and is fabricated by forming a pattern of a silver nanowire film and drying and curing the silver nanowire film through a vacuum baking process in a vacuum oven for 30 seconds~30 minutes at a temperature of 20~50° C. and a hardening process for 15~60 minutes at a temperature of 80~250° C.

2. The OLED device according to claim 1, further comprising a protective layer, the protective layer being formed on the anode, and the protective layer including a conductive polymer material.

3. The OLED device according to claim 2, wherein the conductive polymer material includes at least one selected from a group consisted of polyacetylene, polythiophene, polypyrrole, polyaniline, polyphenylene, polyphenylene acetylene, and polydiacetylene.

4. The OLED device according to claim 2, further comprising a hole injection layer and a hole transport layer disposed between the anode and the organic light emitting layer, and an electron transport layer and an electron injection layer disposed between the organic light emitting layer and the cathode.

5. The OLED device according to claim 4, wherein the protective layer is disposed between the anode and the hole injection layer.

6. A display substrate, comprising an organic light emitting diode (OLED) device, the OLED device comprising:
a base substrate; and
an anode, an organic light emitting layer, and a cathode which are sequentially stacked on the base substrate,
wherein the anode includes a silver nanowire material and is fabricated by forming a pattern of a silver nanowire film and drying and curing the silver nanowire film through a vacuum baking process in a vacuum oven for 30 seconds~30 minutes at a temperature of 20~50° C. and a hardening process for 15~60 minutes at a temperature of 80~250° C.

7. The display substrate according to claim 6, wherein the OLED device further comprises a protective layer, the protective layer being formed on the anode, and the protective layer including a conductive polymer material.

8. The display substrate according to claim 7, wherein the conductive polymer material includes at least one selected from a group consisted of polyacetylene, polythiophene, polypyrrole, polyaniline, polyphenylene, polyphenylene acetylene, and polydiacetylene.

9. The display substrate according to claim 7, further comprising a hole injection layer and a hole transport layer disposed between the anode and the organic light emitting layer, and an electron transport layer and an electron injection layer disposed between the organic light emitting layer and the cathode.

10. The display substrate according to claim 9, wherein the protective layer is disposed between the anode and the hole injection layer.

\* \* \* \* \*